United States Patent
Norton

(10) Patent No.: US 10,374,049 B2
(45) Date of Patent: Aug. 6, 2019

(54) HEAT MANAGEMENT IN A MULTI-FINGER FET

(71) Applicant: ANALOG DEVICES, INC., Norwood, MA (US)

(72) Inventor: Robert R. Norton, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/266,299

(22) Filed: Sep. 15, 2016

(65) Prior Publication Data
US 2018/0076295 A1   Mar. 15, 2018

(51) Int. Cl.
| | | |
|---|---|---|
| H01L 29/423 | (2006.01) | |
| H01L 29/78 | (2006.01) | |
| H01L 29/06 | (2006.01) | |
| H01L 29/417 | (2006.01) | |

(52) U.S. Cl.
CPC ...... *H01L 29/4238* (2013.01); *H01L 29/0696* (2013.01); *H01L 29/41758* (2013.01); *H01L 29/7816* (2013.01)

(58) Field of Classification Search
CPC .................................................. H01L 29/4238
See application file for complete search history.

(56) References Cited

U.S. PATENT DOCUMENTS

| | | | | |
|---|---|---|---|---|
| 2004/0051114 A1* | 3/2004 | Brindle | ............... | H01L 27/0203 257/151 |
| 2009/0134430 A1* | 5/2009 | Abe | ............... | H01L 23/4824 257/208 |
| 2009/0243725 A1* | 10/2009 | Abe | ............... | H01L 23/585 330/277 |
| 2010/0176435 A1* | 7/2010 | Sato | ............... | H01L 27/11519 257/319 |
| 2012/0286135 A1* | 11/2012 | Gong | ............... | G05F 1/56 250/200 |
| 2016/0099324 A1* | 4/2016 | Chang | ............... | H01L 21/28114 257/401 |
| 2016/0118462 A1* | 4/2016 | Tseng | ............... | H01L 29/66795 257/386 |

* cited by examiner

*Primary Examiner* — Mounir S Amer
(74) *Attorney, Agent, or Firm* — Knobbe, Martens, Olson & Bear LLP

(57) ABSTRACT

The present disclosure addresses thermal issues in a multi gate finger field-effect transistor (FET) by providing a multi-gate finger FET arrangement where the respective distances between the multiple gate fingers are modulated along the device, such that the distances between the gate fingers in or towards the middle of the device are greater than the distances between the gate fingers at the or towards the edge of the device. By providing the greater distances between gate fingers located in or towards the middle of the device then improved thermal management properties are obtained, and the device as a whole is maintained cooler than would otherwise be the case, with associated improvements in device lifetimes.

23 Claims, 13 Drawing Sheets

HEAT MANAGEMENT IN A MULTI-FINGER FET

FIELD OF DISCLOSURE

The present disclosure relates to techniques for managing heat generation in a multi-gate finger field effect transistor (FET), which in some examples may be used for high power RF amplification purposes. In some examples heat management is obtained by modulating the distance between gate fingers in dependence on the position of the gate finger within the device.

BACKGROUND

Multiple gate finger field effect transistors (FETs) are often used for RF power amplifier applications. They typically comprise parallel elongate "finger-like" electrodes that extend over respective channel regions formed between side-by-side alternating drain and source regions formed in a substrate. Typically 3, 5, or 7 parallel gate fingers are included in a single device, and the spacing between the fingers is usually fixed to be the same, or alternatively may alternate between two values from inter-finger spacing to spacing across the device.

One of the issues with such transistors in use is that thermal build-up can occur, particularly in the center of the device adjacent the middle gate fingers. That is, as the device operates thermal energy will build up around the gate fingers, and slowly dissipate through the substrate. Due to the presence of multiple gate fingers in or around the center of the device thermal energy will build up in the region faster than it dissipates, resulting in an increase in the temperature of the operating substrate. Increased operating temperatures reduce device lifetimes and increase thermal noise within the device, and hence are undesirable.

SUMMARY OF DISCLOSURE

With a view to addressing thermal issues in a multi gate finger FET, the present disclosure relates to a multi-gate finger FET arrangement where the respective distances between the multiple gate fingers are modulated along the device, such that the distances between the gate fingers in or towards the middle of the device are greater than the distances between the gate fingers at the or towards the edge of the device. By providing the greater distances between gate fingers located in or towards the middle of the device then improved thermal management properties are obtained, and the device as a whole is maintained cooler than would otherwise be the case.

In view of the above from one aspect one example of the present disclosure provides a transistor device comprising a plurality of active regions formed within a semiconductor substrate. The active regions are respectively separated by other regions having terminal electrodes formed thereon, the terminal electrodes comprising conductive elements separated one from another by respective inter-electrode distances. The inter-electrode distances increase from the edges of the device towards the middle of the device, which prevents thermal build-up in the middle of the device, so the device is maintained cooler than would otherwise be the case during operation.

In one example the transistor is a FET, and the active regions are respective source and drain regions alternating across the device, separated one from the other by channel regions, the terminal electrodes being gate electrodes.

In one example the conductive elements are elongate and extend substantially parallel to one another. In such an example the active regions typically extend in a linear array next to one another from one side of the device to the other separated by the other regions, the elongate conductive elements extending substantially orthogonally to the direction of the linear array.

In one example, the inter-electrode distances may increase by a fixed amount from one distance to the next towards the middle of the device, whereas in another example the inter-electrode distances may increase by a relative fractional amount from one distance to the next towards the middle of the device. In either case the inter-electrode distances may be arranged with a maximum permitted inter electrode distance, so as to prevent the device from becoming too large.

From another aspect an example of the present disclosure provides a multi-gate finger FET, comprising an array of alternating source and drain regions separated by respective channel regions; and conductive gate fingers extending over the channel regions. Respective distances between the gate fingers are then modulated according to a monotonic function from the edges of the array towards the middle of the array. The modulation of the distances by the monotonic function means that in operation the device does not get as hot as would otherwise be the case.

In one example the monotonic function is such that the respective distances increase by a fixed amount from finger to finger, whereas in another example the monotonic function is such that the respective distances increase by a relative amount from finger to finger. For example, in this second example the monotonic function is such that a second distance between the gate fingers is greater in size than a first distance between the gate fingers by a fractional amount of the first distance.

In one example the respective distances between the gate fingers are symmetrical about the middle of the array, and further may be modulated according to the monotonic function subject to a maximum allowable distance between gate fingers. Applying a maximum allowable distance prevents the device from becoming excessively large.

An example from a yet further aspect of the disclosure provides a multi-gate transistor having multiple gate electrodes formed over respective channel regions, the multiple gate electrodes being separated from each other by inter-gate distances. First, second and third consecutive inter-gate distances are provided between at least four of the multiple gate electrodes, and the first, second, and third inter-gate distances increase from distance to distance such that the third inter-gate distance is larger than the second inter-gate distance, and the second inter-gate distance is larger than the first inter-gate distance. With such an arrangement, thermal management of the transistor in the vicinity of the multiple gate electrodes is improved.

In one example the three consecutive inter-gate distances increase by a fixed amount from distance to distance, with the fixed amount being, for example, within the range 10% to 40% of the first inter-gate distance. Such an increase has been found to give improved thermal performance without overly increasing the size of the device.

Alternatively, in another example the three consecutive inter-gate distances increase by a predetermined percentage amount of the previous inter-gate distance, whereby the second inter-gate distance is a fraction of the first inter-gate distance larger than the first inter-gate distance, and the third inter-gate distance is a fraction of the second inter-gate distance larger than the second inter-gate distance. The predetermined percentage amount may be again within the range 10% to 40%.

In one example the transistor is a multi-gate-finger FET, and the multiple gate electrodes comprise electrically common elongate fingers extending over the channel regions substantially parallel to each other.

Further features, embodiments, and advantages of the present disclosure will be apparent from the following description and from the appended claims.

BRIEF DESCRIPTION OF THE DRAWINGS

Examples of the present disclosure will now be described with reference to the accompanying drawings, wherein like reference numerals refer to like parts, and wherein.

DETAILED DESCRIPTION

In the examples of the present disclosure to be described below, the issue of thermal energy build up within a multi-finger FET having an array of parallel gate finger electrodes formed on a substrate is addressed by increasing the distance between gate fingers of the multi-finger FET towards the middle of the device. As a consequence, those gate fingers in or towards the middle of the array of gate fingers in the transistor are further apart from each other than those gate fingers that are at or towards the edge of the array of gate fingers. This increased distance prevents excessive thermal energy build-up in the center of the device, whilst not overly increasing the entire size of the device. The reduced thermal build up during operation that occurs as a consequence of this arrangement means that device lifetimes are improved, and less thermal noise generated in output signals from the transistor.

Figure 1:
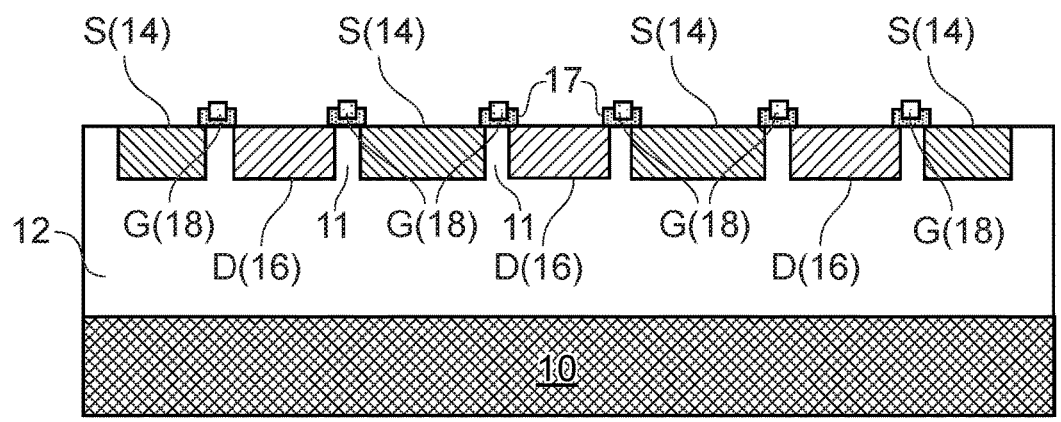
FIGS. 1 and 2 are diagrams of a multi-gate finger FET arrangement where the distance between the gate fingers alternates between two values.
Figure 2:
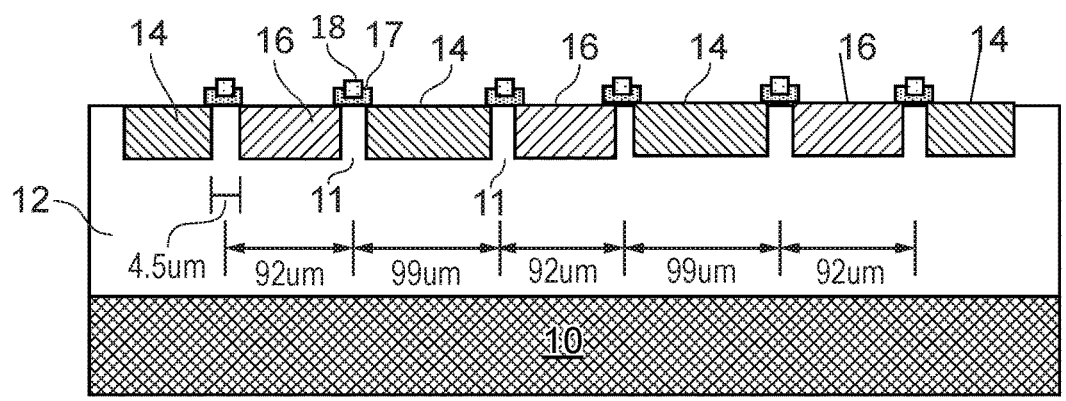

To provide further context and detail, multiple gate finger field effect transistors (FETs) are often used for RF power amplifier applications. With reference to FIGS. 1 and 2, the transistors typically have a structure where drain and source regions (16, 14) are formed alternately side by side within a substrate (12), with a narrow channel between each region extending across the width of each region. Deposited on top of each channel is an oxide layer (17), on top of which are further formed respective gate electrodes (18), in respective parallel elongate "finger" type structures. The gate fingers are electrically connected to a common gate input terminal; likewise the respective drain regions are electrically connected to a common drain terminal, and the respective source regions are also electrically connected to one or more common source terminals, which in use may often be connected to an RF ground. The substrate (12) will usually be mounted on a base die (10).

One design parameter for a multi gate finger FET is the distance between the gate finger terminals over the narrow channels, which can alternatively be thought of as the distance between the channels, and which is referred to as the gate finger pitch. Usually the gate finger pitch is either fixed (for example, there is 100 μm between each finger), in which case the corresponding neighboring drain and source regions are then typically each of the same width, or the gate finger pitch may alternate between two (usually close) values, which may be for example 10% different from each other (for example 100 μm, and 110 μm). Where the gate finger pitch alternates, this means that the alternating drain and source regions alternate in width by the same amount. For example, in FIGS. 1 and 2, the drain regions are shown as 92 μm wide, and the source regions as 99 μm, with very narrow channel width, of approximately 4.5 μm, therebetween.

With such devices the inventor has noted that during operation as an RF power amplifier there can be thermal build up within the device which raises the internal temperature of the device to potentially damaging levels, reducing device lifetime. The amount of thermal build-up is dependent upon the backing die for the semiconductor substrate, and FIGS. 3, 4, and 5 illustrate the results of thermal simulations for a 6 gate finger FET such as shown in FIGS. 1 and 2 with alternating gate finger pitches of 92 μm and 99 μm respectively.

Figure 3:
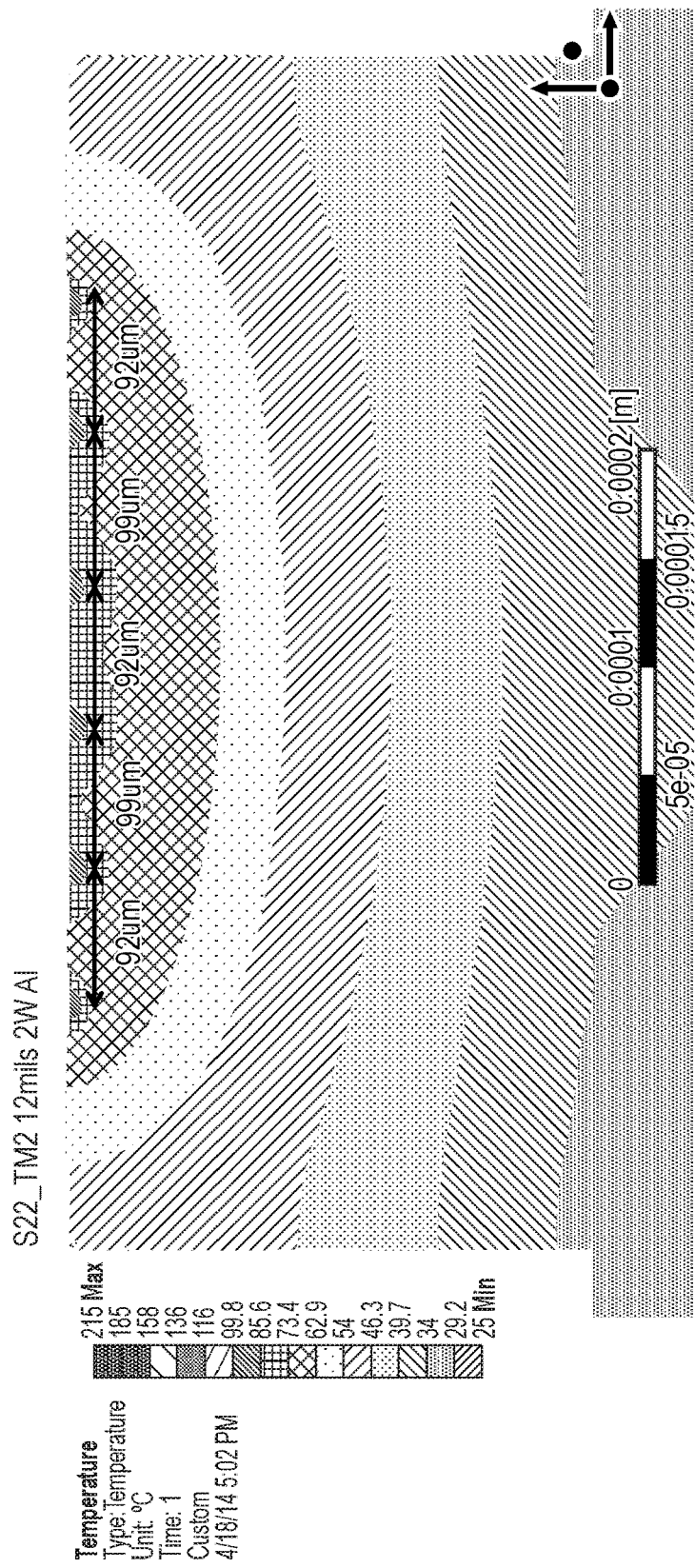
FIGS. 3, 4, and 5 illustrate the results of thermal simulations of the multi-gate finger FET arrangement of FIGS. 1 and 2.

FIG. 3 illustrates the results of a thermal simulation of a FET device having the configuration of FIG. 1 or 2, and a first type of die backing (Al). Here the positions of the gate fingers can be seen in the thermal simulation as hot spots, with temperatures between 85.6° C. and 99.8° C. in the immediate vicinity of each gate finger, surrounded by a relatively large volume of substrate that is heated to between 73.4° C. and 85.6° C. Moreover, it will be seen that the volumes of higher temperatures are much larger around the gate fingers in the middle of the array of fingers than those at the edge, indicating that these gate fingers get hotter.

Figure 4:
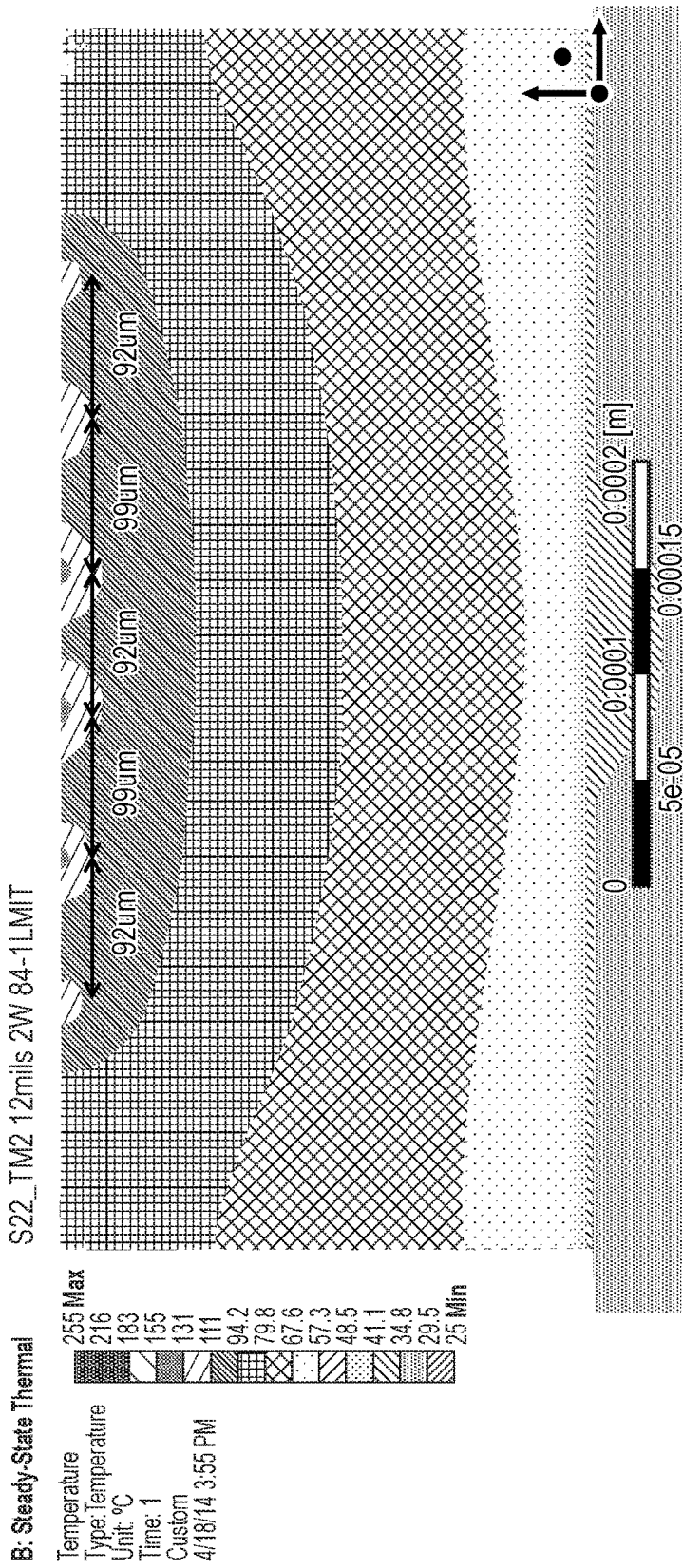

FIG. 4 shows the same device with a second type of die backing (84-1LMIT), which makes the thermal situation much worse. In this simulation, there are volumes around each gate finger with temperatures in the range of 111° C. to 131° C., whilst some of the gate fingers in the middle of the device show temperatures in their immediate vicinity of between 131° C. to 155° C. Such operating temperatures will significantly reduce device lifetimes and/or increase thermal noise.

Figure 5:
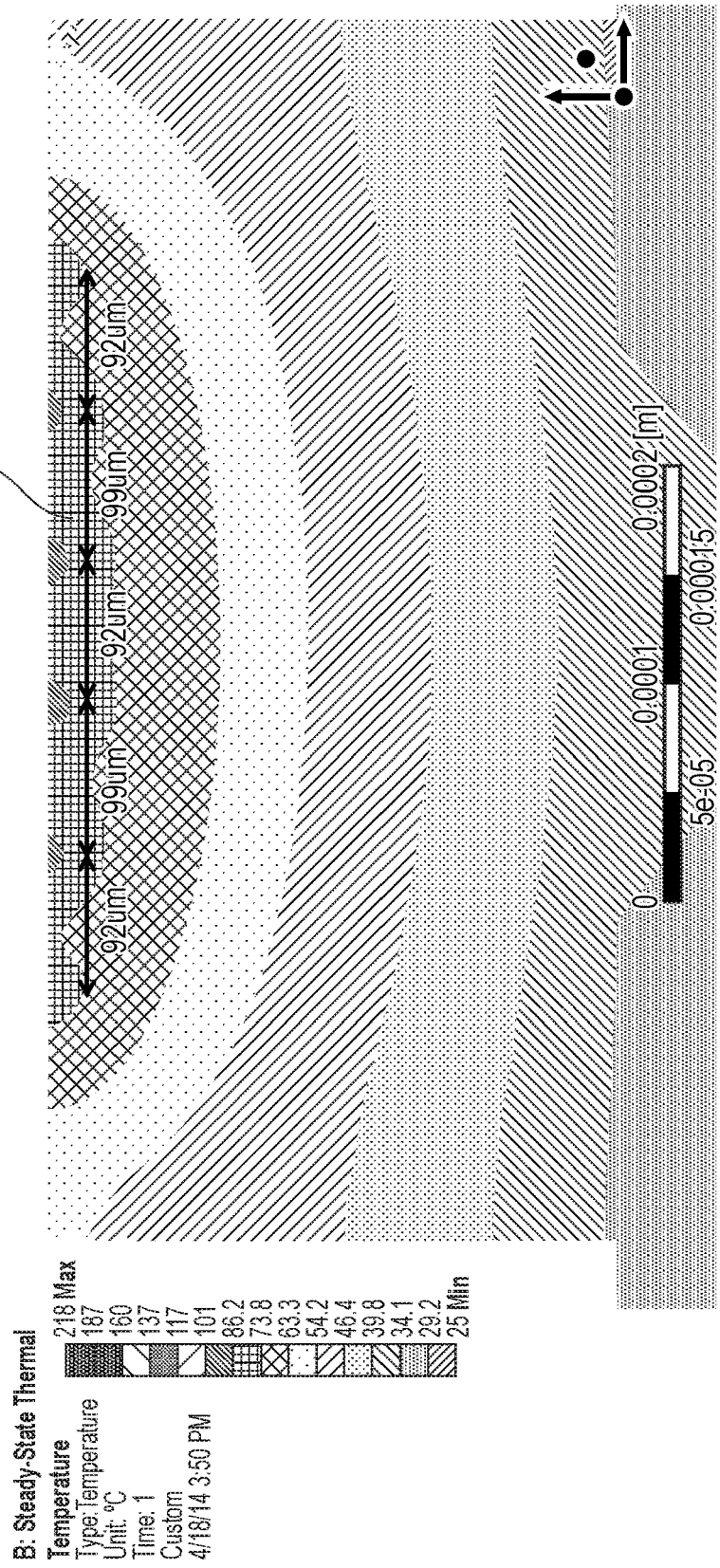

FIG. 5 shows the results of a thermal simulation of the same device as used in FIGS. 3 and 4, but this time with a third type of die backing (D591) which has a higher thermal conductivity than the second die type, and which improves the thermal situation when compared to the example of FIG. 4, but which still shows some thermal build-up, similar to and in fact slightly larger than the example of FIG. 3. That is, the temperatures in the immediate vicinity of each gate finger are typically between 85.6° C. and 99.8° C., but these are surrounded by a relatively large volume of substrate (52) that is heated to between 73.4° C. and 85.6° C.

As shown by these examples, there can be significant thermal build up within multi gate finger FETs during operation, which will impact upon device lifetimes, potentially shortening the lifetimes considerably. Whilst choice of die backing can affect the situation and improve it to some extent, in order to ameliorate the issue completely and increase device lifetimes other design changes would appear to be required.

In view of the above described context, examples of the present disclosure address the thermal issues in a multi gate finger FET as described previously by varying the distance between the gate fingers across the device, and in particular by making the distance between fingers located in or towards the middle of the device greater than the distance between fingers located at or towards the edge of the device. In this respect, multi gate finger FETs typically comprise an array of alternating drain and source regions, separated by narrow channel regions, on top of which are formed narrow, "finger"-like gate electrodes, separated from the narrow channel region via a narrow oxide layer. In examples of the present disclosure, the widths of the alternating drain and source regions are modulated across the device, such that the widths of the regions are greater towards the center of the array of regions, and lesser towards the edges of the array of regions. By modulating the widths of the drain and source regions in this manner, the effective distance between the gate finger electrodes, which lie above the channel regions between the drain and source regions, is also modulated in the same way. By altering the spacing between the gate fingers in this way, thermal build up in the center of the device can be better controlled, and the regions of semiconductor around the gate fingers do not get as hot during operation as the previously described cases where the fingers are either equally distributed across the device, or where the distances alternate between a smaller value and a greater value from finger to finger.

In terms of the distances between the fingers, as described above, in examples of the present disclosure the distances between fingers get greater from the fingers at either edge of the array of fingers towards the middle, such that in at least one example the fingers in the middle of the array of fingers have the greatest separation from one another. In this respect, examples of the present disclosure are intended to be used with multi gate finger FET devices having at least 4, and preferably at least five or more gate fingers. For most RF power applications, multi gate finger FETS will have an even number of fingers, and hence in some examples, described later, 6 or 8 gate fingers may be included. In other examples, even more gate fingers can be used, and the concepts of the present disclosure can be readily applied thereto.

With respect to how the distances between the fingers are modulated, the inventor has found that the distance from finger to finger should increase by at least 10%, but more preferably 20%, to as high as 40%, from the fingers at the outer edges of the array of fingers towards the finger or fingers in the middle of the array. In some examples, if the device is particularly large with a large number of fingers, there may be a maximum distance between fingers that is allowed, in which case the distance between fingers will increase from each edge up to that maximum, and then the fingers in the middle of the array will be at that maximum distance from one another.

In terms of how the increase is applied, in some examples the increase may be on an "absolute" or "simple" basis, in that the same absolute distance increase is applied from finger to finger towards the middle as was applied between the second and third fingers in the array from the edge. Thus, for example, if the increase is to be 20% applied on an "absolute" basis, and the distance between the first and second fingers is 50 µm, then the distance between the second and third fingers should be 50+(50*20%)=60 µm, and the distance between the third and fourth fingers should be 50+2(50*20%)=70 µm etc etc, from finger to finger, until the middle finger or fingers is/are reached, or a maximum inter-finger distance is reached. In this case, the distance increases by a fixed amount i.e. (50*20%)=10 µm, from finger to finger towards the middle of the array of fingers i.e.

$$Wn=W1+(n-1)(A) \text{ for } n=1,2,\ldots,x/2 \quad \text{(Eq. 1)}$$

where Wn is the width of the nth consecutive inter finger distance between gate fingers from one edge of the array of source or drains up to the middle of the array, W1 is the width of the outermost inter-finger distance (i.e. between the outermost first and second fingers) which is set at a known initial distance (e.g. 50 µm in the example above), A is the desired increase in inter-finger distance from finger to finger from the outermost fingers in towards the center (e.g. 10 µm in the example above), and x is the number of inter finger distances provided by the array.

In other examples, the increase may be applied on a "compound" or "relative" basis, in that the distance between respective gate fingers in the array of gate fingers increases as a percentage of the distance between the pair of gate fingers next further out towards the edge of the array of fingers. Thus, for example, if the increase is to be 20% applied on a "relative" basis, and the distance between the first and second fingers is 50 µm, then the distance between the second and third fingers should be 50+(50*20%)=60 µm, and the distance between the third and fourth fingers should be 60+(60*20%)=72 µm etc etc, from finger to finger, until the middle finger or fingers is/are reached, or a maximum inter-finger distance is reached. In this case, the distance increases by an increasing amount from finger to finger towards the middle of the array of fingers i.e.

$$Wn=Wn-1+B(Wn-1) \text{ for } n=2,3,\ldots,x/2$$

$$Wn=W1 \text{ for } n=1 \quad \text{(Eq. 2)}$$

where Wn is the width of the nth consecutive inter finger distance between gate fingers from one edge of the array of source or drains up to the middle of the array, W1 is the width of the outermost inter-finger distance (i.e. between the outermost first and second fingers) which is set at a known initial distance (e.g. 50 µm in the example above), B is the desired relative percentage increase in inter-finger distance from finger to finger from the outermost fingers in towards the center (e.g. 20% in the example above), and x is the number of inter finger distances provided by the array.

In both examples above, the calculated widths may be subject to a maximum permitted width, which also represents the maximum permitted inter-finger distance, for example in the range 150 to 200 µm, above which the increase in device size is considered too great for the marginal increase in thermal performance thus obtained.

More generally, the distances between fingers are modulated according to a monotonic function from the edges of the array of fingers towards the middle of the array, unless a maximum distance is reached. With such a function, the distances between fingers increase from the edges of the array of fingers towards the middle, subject to any maximum threshold distance. With such arrangements thermal management of the device is improved.

Figure 6:
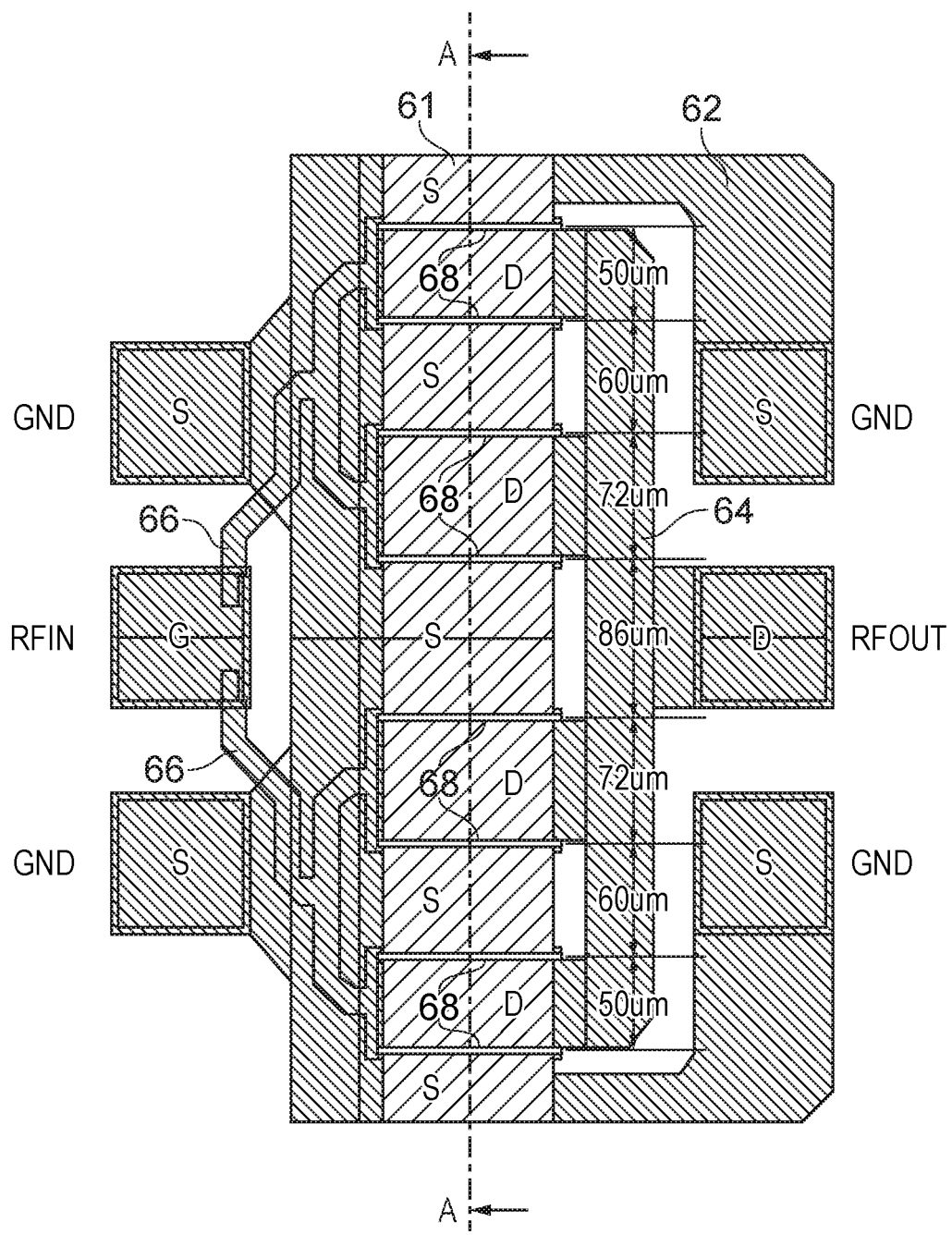
FIG. 6 is a diagram of the arrangement of a multi-gate finger FET according to an example of the present disclosure.
Figure 7:
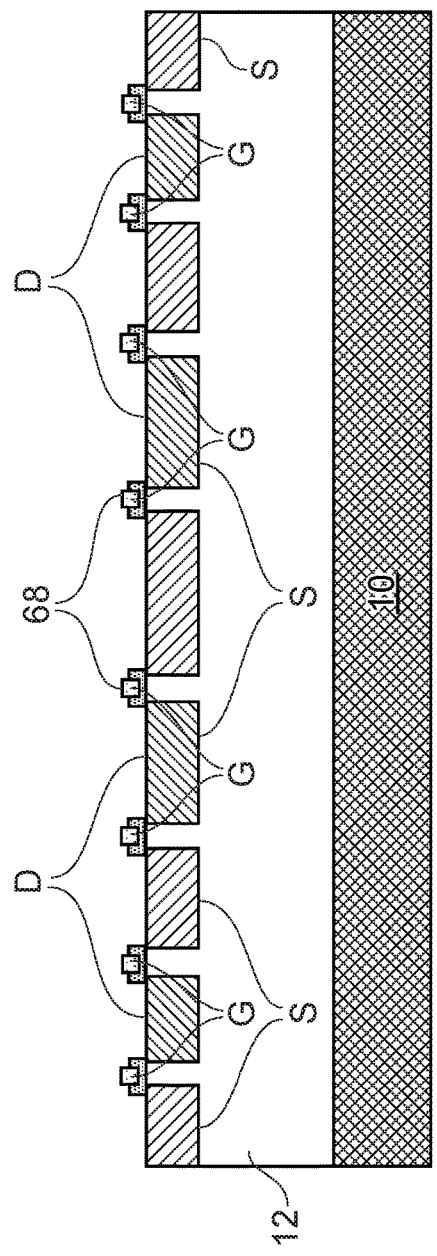
FIGS. 7 and 8 are cross-sectional diagrams of the multi-gate finger FET of FIG. 6 taken along the line A-A.
Figure 8:
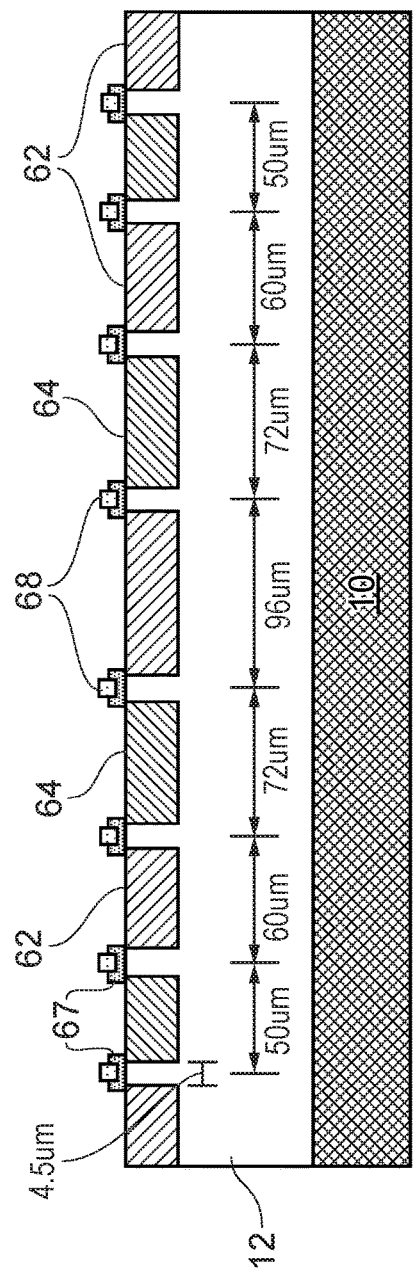

One example multi gate finger FET device according to the present disclosure is shown in FIGS. 6 to 8, where FIGS. 7 and 8 are cross-sections of the device of FIG. 6 taken along the line A-A, and looking in the direction of the arrows. Here an array 61 of source and drain semiconductor regions are formed on a semiconductor substrate, with alternating source and drain regions in an array across the device. Each source and drain region is separated by respective channel regions, on top of each of which is formed small respective oxide layers 67, having respective narrow (of the order of 4.5 µm) gate finger electrodes 68 formed thereon. As shown in FIG. 6, the respective gate finger electrodes extend laterally across the entire width of the array of drain and source regions, in a direction substantially orthogonal to the direction of the array of drain and source regions. The gate finger electrodes are connected via respective gate vias 66 to a common gate electrode (RFIN), which in use constitutes an input node to the device.

Each respective source region (S) in the array of source and drain regions is connected via an electrically common source via 62 to ground connections, and each respective drain region (D) in the array of source and drain regions is connected via an electrically common drain via 64 to a drain electrode, which in use constitutes an output node of the device.

As shown particularly in FIGS. 6 and 8, in order to improve the thermal properties of the device, in this example the gate fingers are separated from one another by an increasing distance from the edge of the device towards the middle of the device. In particular, in this example there is an array of 9 source and drain regions, with 5 source regions interleaved with 4 drain regions, each separated by a channel region above which the gate fingers are formed. There are thus 8 gate fingers 68 in total, which are separated by an increasing distance from the edge of the device towards the center of the device. In particular, from FIG. 8 it can be seen that the distance between the first and second fingers 68 from the left hand side is set at 50 µm, with the distance between the second and third fingers increasing to 60 µm, and the distance between the third and fourth fingers increasing further still to 72 µm. The distance between the fourth and fifth fingers, which represents the middle of the array of fingers, is then greatest, at 96 µm, and then the distances start to reduce again from the middle of the array of fingers out towards the opposite edge. That is, the distance between the fifth and sixth fingers from the left decreases to 72 µm, between the sixth and seventh fingers to 60 µm, and then finally, from the seventh finger to the outermost eighth finger the distance reduces back to 50 µm. With this arrangement a relative 20% increase in distance from one finger to the next is obtained from the outermost fingers at either side in the array of fingers to the middlemost fingers, which distances between fingers helps to reduce thermal loading within the device, and improve device operation (by reducing thermal noise) and lifetime.

Figure 9:
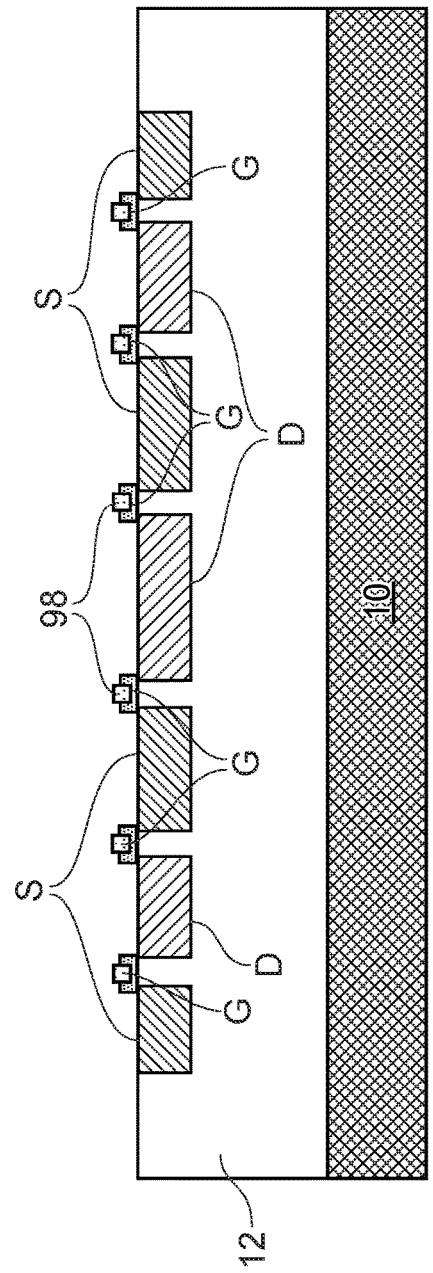
FIGS. 9 and 10 are cross-sectional diagrams of a multi-gate finger FET according to another example of the present disclosure.
Figure 10:
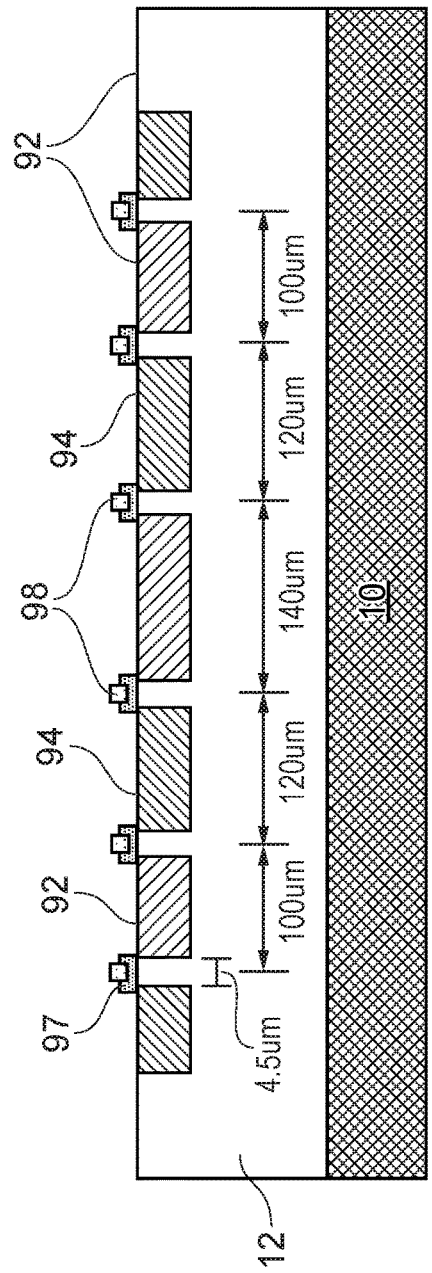
Figure 11:
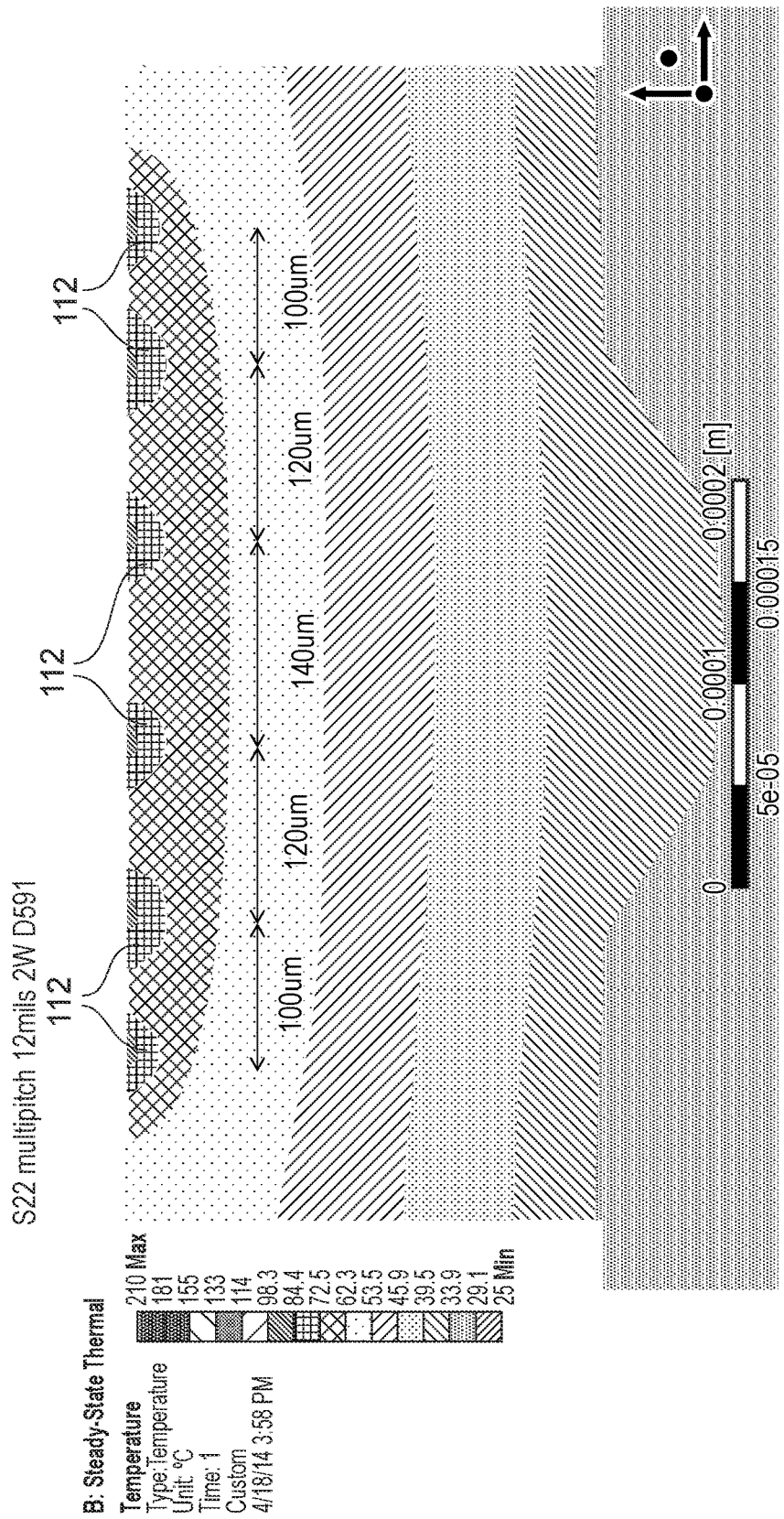
FIG. 11 illustrates the result of a thermal simulation of the multi-gate finger FET of FIGS. 9 and 10.

A further example device is shown in FIGS. 9 and 10, and a thermal simulation of the operation of the device is shown in FIG. 11. In the thermal simulation of FIG. 11, the same die backing for the device is assumed as in the background thermal simulation example of FIG. 5.

The further example is similar to the previous example, but with the difference that the increase in spacing between the gate fingers from the edge of the device towards the middle is slightly different. In particular, rather than increasing by a relative percentage amount as in the first example, in this example the distances between the gate fingers increase by a fixed amount each time, from finger to finger.

More particularly, as shown in FIGS. 9 and 10 an array of source and drain semiconductor regions are formed on a semiconductor substrate, with alternating source (94) and drain (92) regions in an array across the device, with each source and drain region being separated by respective channel regions, on top of each of which is formed small respective oxide layers 97, having respective narrow (of the order of 4.5 µm) gate finger electrodes 98 formed thereon. In this example, as mentioned, the distances between the gate fingers 98 increase according to a set amount, in this case 20 µm, from finger to finger. Six gate fingers 98 are provided in total, such that the distance between the first finger on the left of the device and the next finger in the array is 100 µm, the distance between the second finger and the third finger in the array of fingers is 120 µm, and the distance between the third and the fourth fingers in the array (which defines the middle of the device) is the greatest distance, at 140 µm. As will be seen, in this example, the inter finger distance increases by a fixed amount, namely 20 µm in this example, from finger to finger. From the greatest middle distance, the distances then get less moving back towards the opposite outer edge of the array of fingers. That is, the distance between the fourth finger and the fifth finger reduces back to 120 µm, and then finally the distance between the fifth and the outer sixth finger reduces again by the same fixed amount to 100 µm.

The structure of FIGS. 9 and 10 was subject to a thermal simulation assuming the same backing die (D591) as the previously described background example of FIG. 5, with the results being shown in FIG. 11. Due to the same conditions being applied, the results in FIGS. 5 and 11 are directly comparable, and it can be seen from a comparison of the two figures that the thermal build up in the device structure of FIGS. 9 and 10 is much reduced. In particular, consider in FIG. 5 the region of substrate 52 that is heated to between 73.8 and 86.2° C. In the simulation of FIG. 5 this regions extends in an unbroken manner to encompass all of the finger electrodes, and each finger electrode is then also surrounded by substrate in its immediate vicinity which is in the next temperature band of 86.2 to 101° C. Comparing this result directly with the results shown in FIG. 11 for the device of the present second example, it can readily be seen that with the present example the region of substrate that is heated to the range 73.8 and 86.2° C. is broken into small discrete regions 112 around each finger electrode. Moreover, hardly any of the substrate at all falls into the next temperature band upwards of 86.2 to 101° C. Hence, the thermal loading properties of the device are much improved when compared to the background devices, and hence improved device operation with less thermal noise and increased device lifetime is obtained.

Moreover, if one considers the relative device widths of the two comparable devices of FIGS. 2 and 10. In the background device of FIG. 2, where the distances between gate fingers alternate between two values 92 and 99 µm across the width of the device, the total width between the two outermost gat fingers on either side of the device is 474 µm. If the device of FIG. 10 followed the same alternating pattern of inter finger distances, then the corresponding total width would be 540 µm, whereas with the arrangement of the present disclosure where the inter-finger distance increases towards the middle, the corresponding total width is 580 µm, so only 40 µm, or 7.4% wider than in the background case. Hence, whilst the device width is increased using the invented technique, it is not increased considerably.

With respect to the inter-finger increase from finger to finger, as noted above, an increase in the range of 20% to 40% from finger to finger has found to be advantageous, although slightly lower increases, for example down to 10%, may be acceptable. Above about 40% the advantages start to diminish, as the width between finger in the center of the device then become relatively large such that very little further marginal benefit is obtained in the center, although some marginal benefit may still be obtained towards the edges. However, above 40% the device then starts to become large, such that the incremental thermal benefits obtained are offset by increased device size. FIGS. 12 to 16 illustrate several examples of increased rate of inter-finger width growth, from 10% to 40%.

Figure 12:
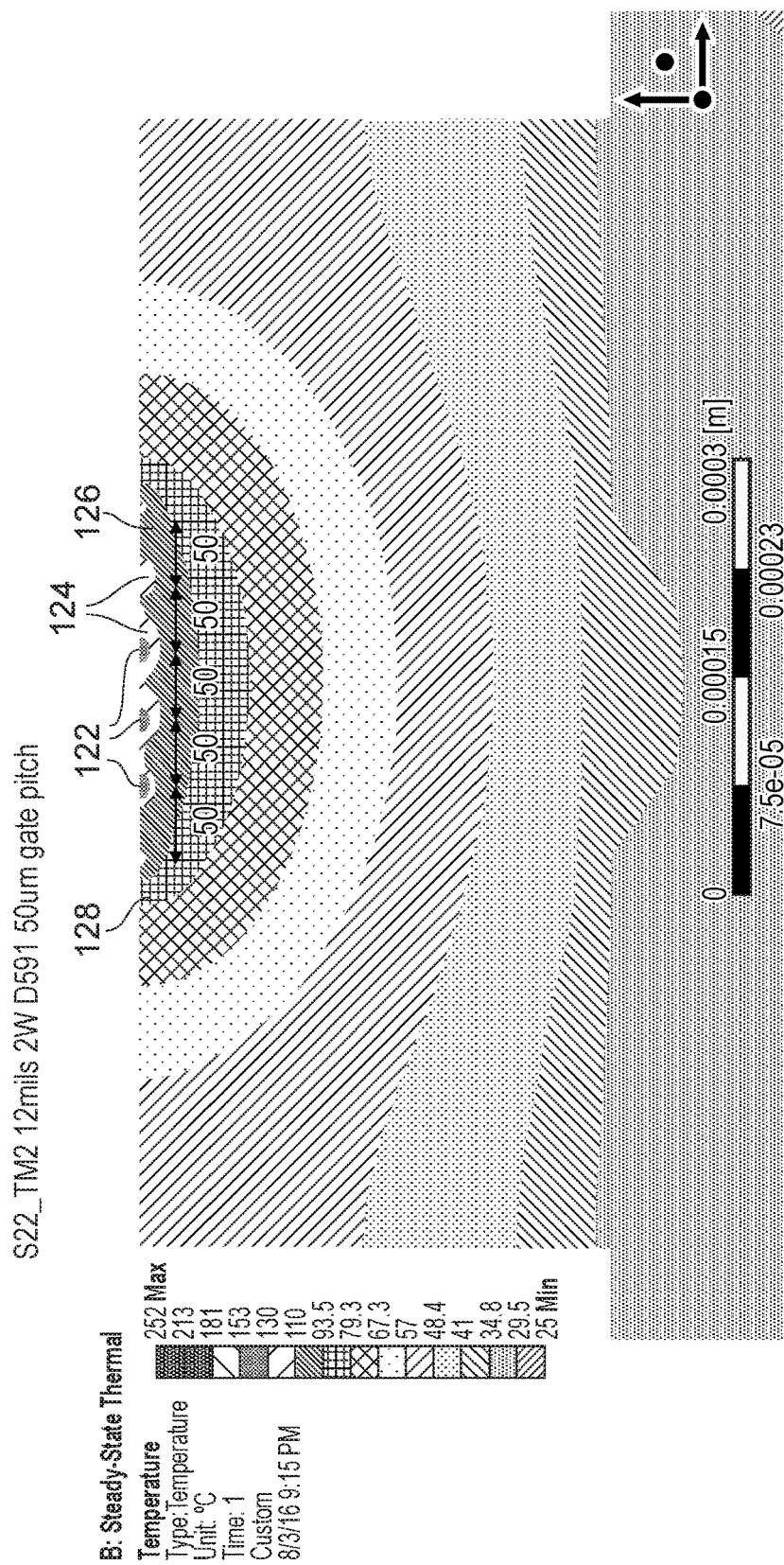
FIGS. 12 to 16 respectively illustrate the results of further thermal simulations of additional examples with different inter-finger distances.

Referring first to FIG. 12, here the results of a thermal simulation of a six-finger multi gate FET formed on a D591 backing die are shown. The example of FIG. 12 relates to a device configuration where the fingers are equidistant from each other, with a 50 μm inter-finger distance between each finger. In this case it will be seen that around the two central figures in the array of figures, as well as slightly around one of the adjacent figures very hot zones 122 are formed, with temperatures above 130° C. Around these zones, and around every other finger, individual hot zones 124 are evident, surrounded by a warm zone 126 that encompasses the hot zones 124. The warm zone 126 is surrounded by a first cool zone 128, which in turn is surrounded by further cooler zones through the substrate, away from the fingers. This background example forms a test case against which examples of the present disclosure, with the inter-finger distances increased, can be compared.

Figure 13:
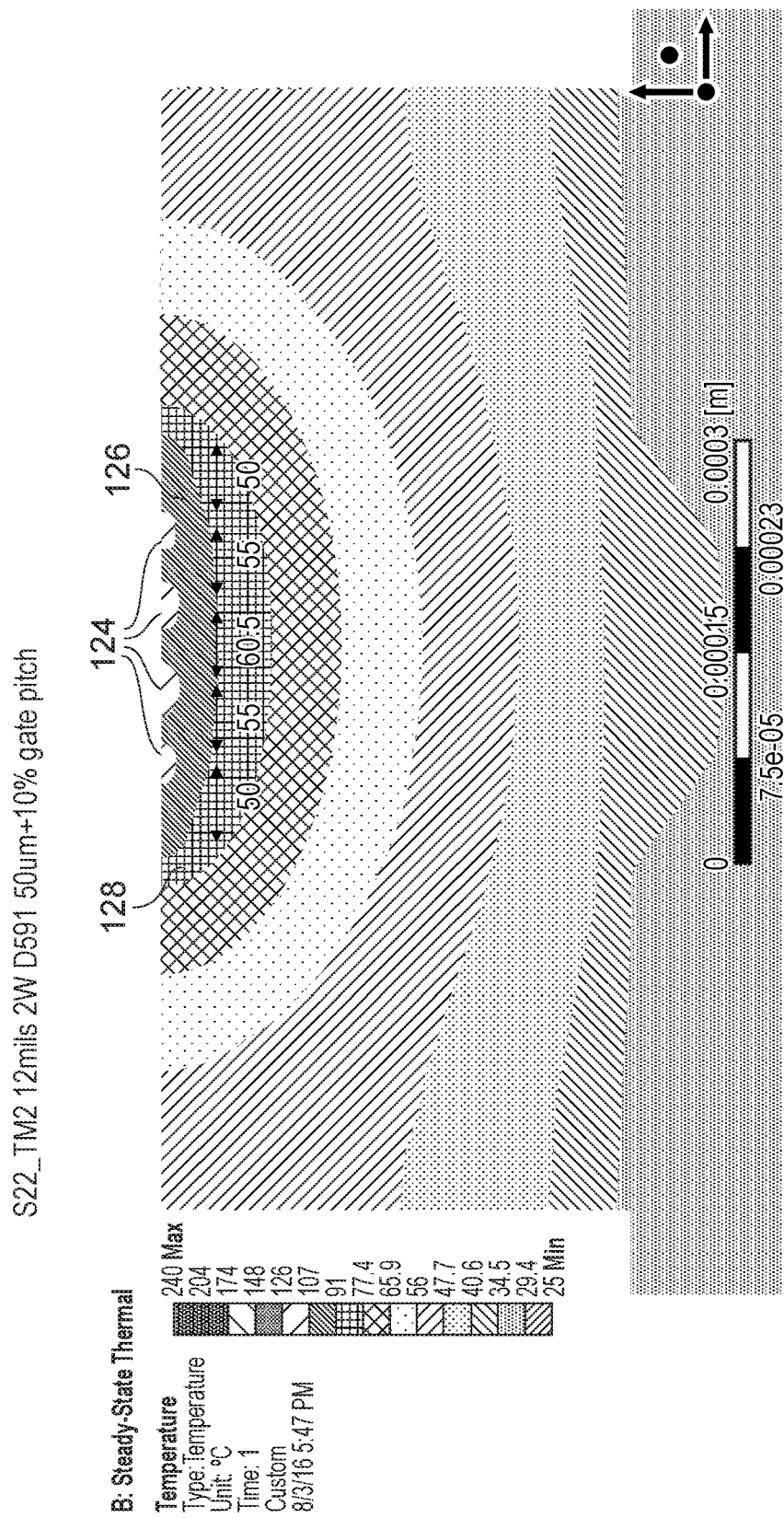

Turning to FIG. 13, therefore, in this example, the inter-gate distances are increased by a relative 10% from finger to finger. Hence, with six fingers and five inter gate distances, the inter gate distances are, from left to right, 50 μm, 55 μm, 60.5 μm (the center), 55 μm, and 50 μm. That is, the device configuration is similar to that shown in FIG. 10, but with the above noted inter-gate distances. With this arrangement it can be seen that there are no longer any very hot zones around any of the fingers, whilst hot zones 124 of any size are formed only around the central four fingers, and not around the outer fingers. The warm zone 126 has increased in extent slightly, and is surrounded by the first cool zone 128. Hence, even with only a 10% increase in inter-finger distance from finger to finger, an improvement in thermal distribution can be seen, as there are no very hot zones, and the hot zones 124 are diminished in size.

Figure 14:
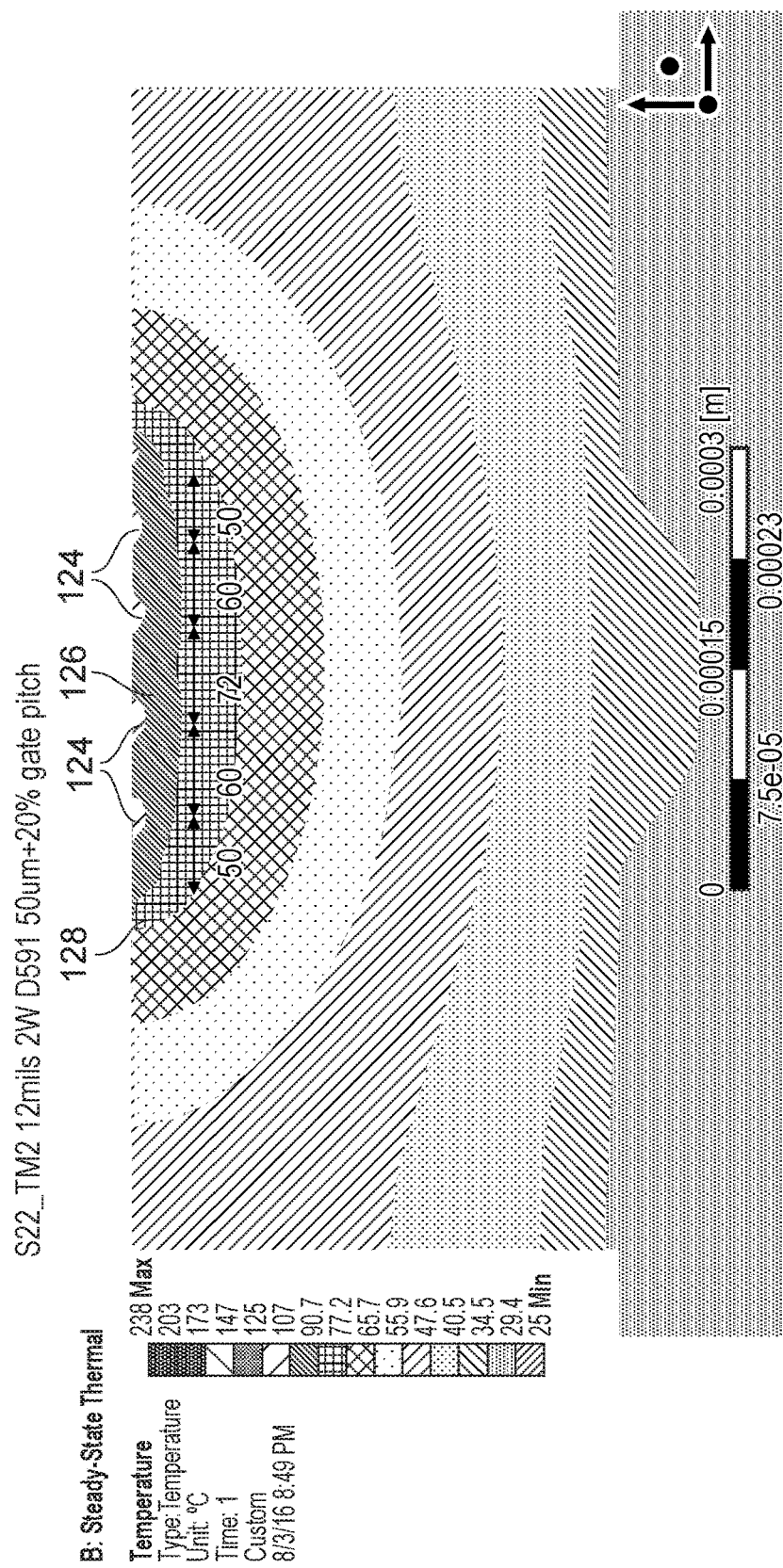

Moving to FIG. 14, in this example, the inter-gate distances are increased by a relative 20% from finger to finger. Hence, with six fingers and five inter gate distances, the inter gate distances are, from left to right, 50 μm, 60 μm, 72 μm (the center), 60 μm, and 50 μm. That is, the device configuration is similar to that shown in FIG. 10, but with the above noted inter-gate distances. With this arrangement it can be seen that again there are no longer any very hot zones around any of the fingers, whilst hot zones 124 are further diminished in size compared to the example of FIG. 13. The warm zone 126 has shrunk slightly, particularly in the middle, where the distance between the two central fingers is greatest. The first cool zone 128 has increased in size, and starts to project into the center of the array of fingers. Such a result is a big improvement on the background case of FIG. 12, as there are no very hot zones 122, the hot zones 124 are very much diminished, and the warm zone 126 has also start to shrink in favour of the first cool zone 128.

Figure 15:
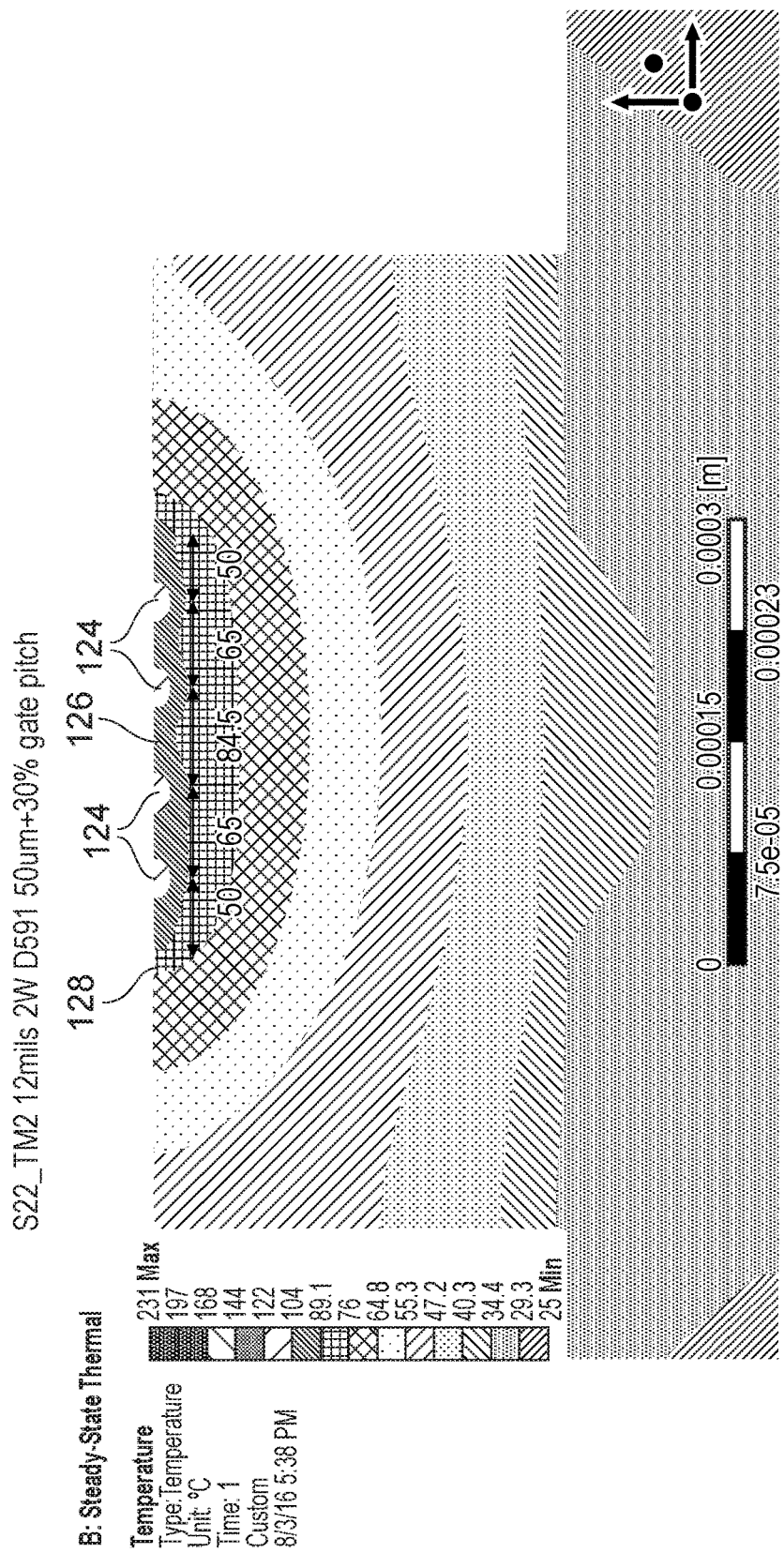

These effects increase with increasing inter-finger distance. In the example of FIG. 15, the inter-gate distances are increased by a relative 30% from finger to finger. Hence, with six fingers and five inter gate distances, the inter gate distances are, from left to right, 50 μm, 65 μm, 84.5 μm (the center), 65 μm, and 50 μm. That is, the device configuration is similar to that shown in FIG. 10, but with the above noted inter-gate distances. With this arrangement it can be seen that there are no very hot zones, the hot zones 124 are severely diminished so as to be negligible, and the warm zone 126 is further shrunken, with a marked reduction in the middle of the finger array. The first cool zone 128 has further grown so as to further project into the middle of the finger array.

Figure 16:
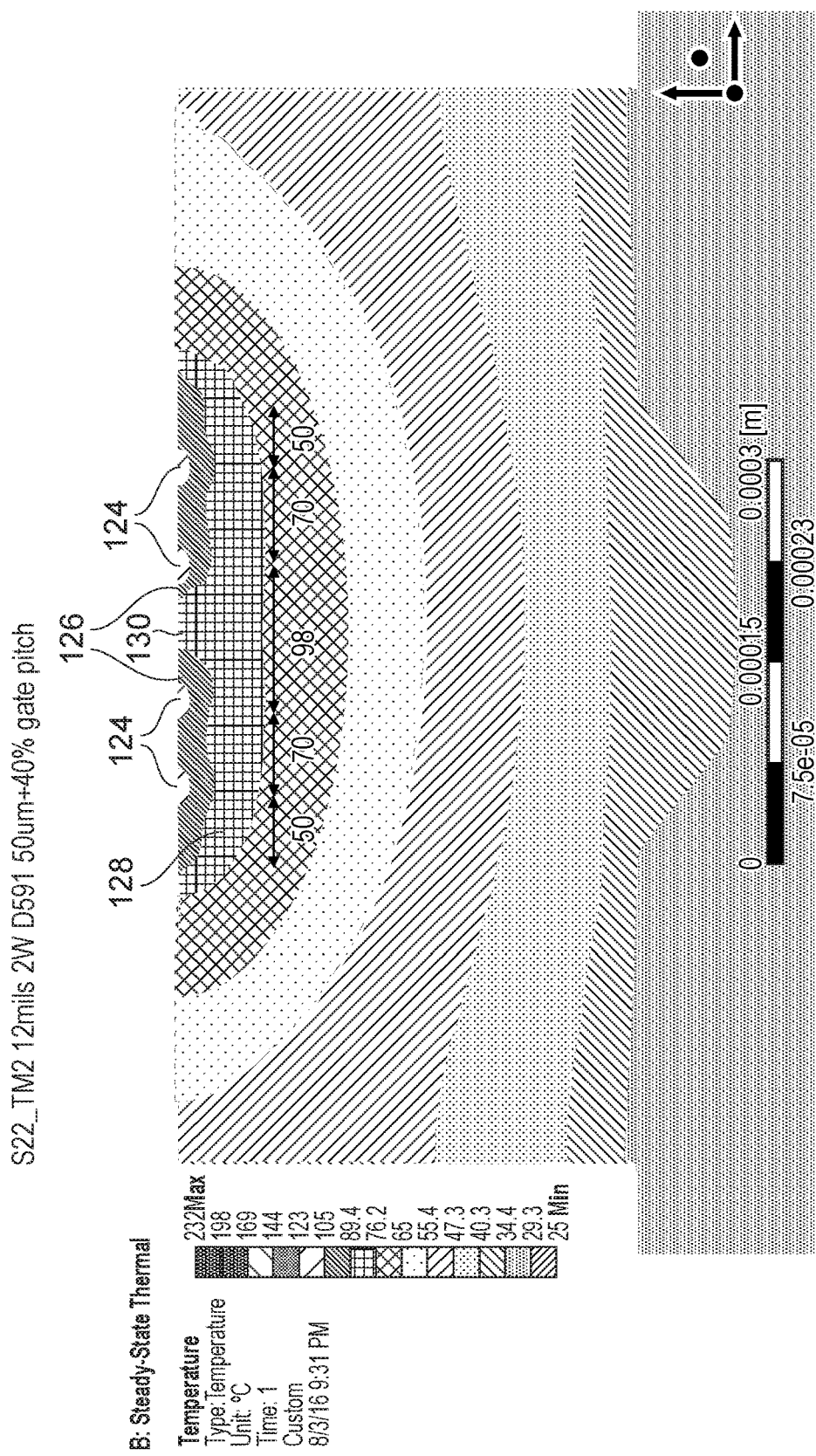

The final example is shown in FIG. 16, where the inter-gate distances are increased by a relative 40% from finger to finger. Hence, with six fingers and five inter gate distances, the inter gate distances are, from left to right, 50 μm, 70 μm, 98 μm (the center), 70 μm, and 50 μm. That is, the device configuration is similar to that shown in FIG. 10, but with the above noted inter-gate distances. With this arrangement it can be seen that there are no very hot zones, and the hot zones 124 are negligible. The warm zone 126 is also much further diminished, and in fact has split into two discrete zones about the middle of the device, with the first cool zone 128 bisecting the warm zones 126 in the center of the device (130). This result shows that an inter-finger distance relative increase of more than 40% is unlikely to be required, as all that would happen is that the area 130 of the first cool zone 128 that bisects the warm zones would simply get unnecessarily wider, thus increasing the device size. Hence, as apparent from these examples an inter-finger distance relative increase of between 10% and 40%, and more preferably from 20% to 40%, improves the thermal characteristics of the device, without increasing the device size unnecessarily.

Various further modifications, whether by way of addition, deletion, or substitution may be made to above mentioned examples to provide further examples, any and all of which are intended to be encompassed by the appended claims.

What is claimed is:

1. A transistor device configured for thermal energy management, the transistor device comprising a plurality of active regions formed within a semiconductor substrate, the active regions being respectively separated by other regions having electrode fingers formed thereon, the electrode fingers being electrically connected to a common gate terminal and comprising conductive elements separated one from another by respective inter-electrode distances, at least three inter-electrode distances increasing from each of two opposing edges of the transistor device towards a middle of the transistor device.

2. The transistor device according to claim 1, wherein the transistor is a multi-gate finger field-effect transistor (FET), and the active regions are source and drain regions alternating across the transistor device, the source and drain regions being separated one from the other by respective channel regions, the electrode fingers being elongate gate electrodes.

3. The transistor device according to claim 1, wherein the conductive elements are elongate and extend substantially parallel to one another.

4. The transistor device according to claim 3, wherein the active regions extend in a linear array next to one another from one side of the transistor device to the other side of the transistor device and separated by the other regions, the elongate conductive elements extending substantially orthogonally to a direction of extension of the linear array.

5. The transistor device according to claim 1, wherein the inter-electrode distances increase by a fixed amount from one distance to the next towards the middle of the device.

6. The transistor device according to claim 1, wherein the inter-electrode distances increase by a relative fractional amount from one distance to the next towards the middle of the device.

7. The transistor device according to claim 1, wherein each of the inter-electrode distances is arranged to be less than a maximum permitted inter electrode distance.

8. A multi-gate finger field-effect transistor (FET) configured for power amplification applications that raise thermal energy levels within the FET during operation, the multi-gate finger FET comprising:
 an array of alternating source and drain regions separated by respective channel regions; and
 conductive gate fingers extending over the channel regions, the conductive gate fingers being electrically connected to a common gate terminal,
 wherein at least three distances between adjacent gate fingers are modulated according to a monotonic function from each of two opposing edges of the array towards a middle of the array.

9. The multi-gate finger FET according to claim 8, wherein the monotonic function is such that the respective distances between adjacent fingers from the edges of the array towards the middle of the array increase by a fixed amount.

10. The multi-gate finger FET according to claim 8, wherein the monotonic function is such that the respective distances between adjacent fingers from the edges of the array towards the middle of the array increase by a relative amount.

11. The multi-gate finger FET according to claim 10, wherein the monotonic function is such that a second distance between a pair of gate fingers is greater than a first distance between another pair of gate fingers by a fraction of the first distance.

12. The multi-gate finger FET according to claim 8, wherein the respective distances between adjacent gate fingers are symmetrical about the middle of the array.

13. The multi-gate finger FET according to claim 8, wherein the respective distances between adjacent fingers are modulated according to the monotonic function without exceeding a maximum allowable distance between gate fingers.

14. The multi-gate finger FET according to claim 8, wherein respective widths of the alternating source and drain regions are adapted to give the respective distances between the gate fingers, the respective channel widths being substantially identical.

15. A multi-gate transistor having multiple gate electrodes formed over respective channel regions, the multiple gate electrodes being electrically connected to a common gate terminal and separated from each other by inter-gate distances, wherein the inter-gate distances increase from opposing edges of the multi-gate transistor towards a middle of the multi-gate transistor, and wherein at least first, second and third consecutive inter-gate distances between at least four of the multiple gate electrodes increase from distance to distance such that the third inter-gate distance is larger than the second inter-gate distance, and the second inter-gate distance is larger than the first inter-gate distance.

16. The multi-gate transistor according to claim 15, wherein the three consecutive inter-gate distances increase by a fixed amount from distance to distance.

17. The multi-gate transistor according to claim 16, wherein the fixed amount is within the range 10% to 40% of the first inter-gate distance.

18. The multi-gate transistor according to claim 15, wherein the three consecutive inter-gate distances increase by a predetermined percentage amount of the previous inter-gate distance, whereby the second inter-gate distance is a fraction of the first inter-gate distance larger than the first inter-gate distance, and the third inter-gate distance is a fraction of the second inter-gate distance larger than the second inter-gate distance.

19. The multi-gate transistor according to claim 18, wherein the predetermined percentage amount is within the range 10% to 40%.

20. The multi-gate transistor according to claim 15, wherein the multiple gate electrodes comprise electrically common elongate fingers extending over the channel regions substantially parallel to each other.

21. A transistor device configured to manage heat dissipation thereacross, the transistor device comprising:
 a plurality of heat-generating channel regions and a plurality of active regions alternatingly arranged in a semiconductor substrate such that each of the heat-generating channel regions is formed between two adjacent active regions, wherein volumes of the semiconductor substrate available for dissipation of heat from at least three of the heat-generating channel regions decrease from a center of the transistor device towards each of opposing edges of the transistor device; and
 a gate electrode configured for adjusting a rate of heat dissipation across the transistor device.

22. The transistor device of claim 21, wherein the at least three of the heat-generating channel regions with decreasing volumes comprise three consecutive heat-generating channel regions.

23. The transistor device of claim 21, wherein the gate electrode comprises gate electrode fingers over each of the volumes of the semiconductor substrate, wherein distances between adjacent ones of the gate electrode fingers decrease from the center of the transistor device towards the each of the opposing edges of the transistor device.

* * * * *